(12) United States Patent
Minich

(10) Patent No.: US 7,226,298 B1
(45) Date of Patent: Jun. 5, 2007

(54) ELECTRICAL CONNECTOR WITH SEGMENTED HOUSING

(75) Inventor: Steven E. Minich, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/393,051

(22) Filed: Mar. 29, 2006

(51) Int. Cl.
*H01R 12/00* (2006.01)

(52) U.S. Cl. ............................................ 439/83

(58) Field of Classification Search ............ 439/83, 439/86, 874, 876
See application file for complete search history.

(56) References Cited

U.S. PATENT DOCUMENTS

| | | | | |
|---|---|---|---|---|
| 5,102,352 A * | 4/1992 | Arisaka | | 439/608 |
| 5,255,839 A | 10/1993 | Da Costa Alves et al. | | 228/180.21 |
| 5,519,580 A | 5/1996 | Natarajan et al. | | 361/760 |
| 5,527,189 A * | 6/1996 | Middlehurst et al. | | 439/608 |
| 5,538,433 A * | 7/1996 | Arisaka | | 439/70 |
| 5,562,462 A * | 10/1996 | Matsuba et al. | | 439/70 |
| 5,702,255 A | 12/1997 | Murphy et al. | | 439/71 |
| 5,746,608 A | 5/1998 | Taylor | | 439/70 |
| 6,007,348 A * | 12/1999 | Murphy | | 439/70 |
| 6,241,535 B1 | 6/2001 | Lemke et al. | | 439/83 |
| 6,325,280 B1 * | 12/2001 | Murphy | | 228/246 |
| 6,426,564 B1 | 7/2002 | Ball | | 257/783 |
| 6,530,788 B1 * | 3/2003 | Ju | | 439/83 |
| 6,544,046 B1 * | 4/2003 | Hahn et al. | | 439/83 |
| 6,572,397 B2 * | 6/2003 | Ju | | 439/342 |
| 6,638,082 B2 | 10/2003 | Belopolsky et al. | | 439/83 |
| 6,666,693 B2 | 12/2003 | Belopolsky et al. | | 439/79 |
| 6,830,462 B1 * | 12/2004 | Harper, Jr. | | 439/71 |
| 6,855,623 B2 | 2/2005 | Ball | | 438/612 |
| 6,971,885 B2 | 12/2005 | Mowry | | 439/66 |
| 2004/0048504 A1 * | 3/2004 | Hynes et al. | | 439/83 |
| 2005/0009385 A1 * | 1/2005 | Korsunsky et al. | | 439/83 |
| 2006/0016071 A1 | 1/2006 | Huang | | 29/852 |
| 2006/0065972 A1 * | 3/2006 | Khan et al. | | 257/712 |

* cited by examiner

*Primary Examiner*—Neil Abrams
*Assistant Examiner*—Harshad C Patel
(74) *Attorney, Agent, or Firm*—Woodcock Washburn LLP

(57) ABSTRACT

Preferred embodiments of electrical connectors include a plurality of electrically-conductive contacts each having a lead portion, a plurality of solder balls each attached to the lead portion of a respective one of the contacts, and a housing having plurality of pedestals that each receive the lead portion of a respective one of the contacts.

22 Claims, 11 Drawing Sheets

ELECTRICAL CONNECTOR WITH SEGMENTED HOUSING

CROSS-REFERENCE TO RELATED APPLICATIONS

This application is related to U.S. patent application Ser. No. 11/284,154, filed Nov. 21, 2005, which claims priority to U.S. provisional application No. 60/648,561, filed Jan. 31, 2005; and U.S. Pat. No. 6,241,535. The contents of each of these applications and patents is incorporated by reference herein in its entirety.

FIELD OF THE INVENTION

The present invention relates generally to electrical connectors. More specifically, the invention relates to a surface-mount connector, such as a ball-grid array connector ("BGA connector"), having a housing formed with segments that promote air circulation and stress relief.

BACKGROUND OF THE INVENTION

Surface-mount connectors such as BGA connectors typically include a plurality of electrically-conductive contacts mounted in a housing. Each conductor has a solder ball attached to a tail portion thereof. The solder balls collectively form a ball grid array.

The solder balls are used to form electrical and mechanical connections between the connector and a substrate, such as a printed-circuit board (PCB), on which the connector is mounted. The connector is mounted on the substrate by heating the solder balls to their melting point. The molten solder subsequently cools and re-hardens to form solder connections between the connector and the substrate.

The solder balls can be heated by placing the connector and the substrate in a convection reflow oven. The oven directs heated air over the connector. Heat is transferred to the solder balls directly and indirectly, by a combination of conductive and convective heat transfer.

The rate of heat transfer to the individual solder balls usually is not uniform throughout the ball grid array. In particular, the heated air primarily contacts the outermost surfaces the connector, and the outermost solder balls in the ball-grid array, i.e., the solder balls located proximate to the outer perimeter of the ball-grid array. The outermost solder balls therefore tend to receive a higher amount of thermal energy than the innermost, i.e., centrally-located, solder balls.

The need to transfer sufficient thermal energy to the innermost portion of the ball-grid array to melt the centrally-located solder balls can be addressed by slowing the speed of the connector and the substrate through the convection reflow oven, i.e., by increasing the dwell time of the connector and the substrate in the oven. This approach can lower the yield of the oven, i.e., number of connector and substrate pairs that can be processed in the oven per unit time.

Alternatively, the temperature of the heated air within the convection reflow oven can be increased. This approach, however, can result in unintended connector, substrate, or component damage.

Moreover, BGA and other types of connectors typically operate at temperatures above ambient. Temperature changes can cause the connector and its mounting substrate to deflect, i.e., to expand or contract. The amount of deflection of a component as a function of temperature change often is expressed as the coefficient of thermal expansion (CTE) for the component. The amount of deflection experienced by the connector and substrate in response to a given temperature change usually differs. In other words, the CTEs of the connector and the substrate are usually different.

Differences between the amount of thermally-induced deflection of the connector and the substrate can induce stresses on the solder connections between the two components. These stresses, repeated over multiple heating and cooling cycles (referred to as "thermal cycling") can weaken the solder connections. Weakening of a solder connection can affect the integrity of the signal transmission through the solder connection, and in extreme cases can result in separation of the solder connection from the connector or the substrate.

SUMMARY OF THE INVENTION

To help solve uneven heating of surface-mount connectors having fusible elements such as solder balls, the present invention includes an electrical connector that has voids that promote circulation of air through the connector. In general, one aspect of the present invention is to expose more of the center portion of the connector to: (i) heated air during reflow; and (ii) ambient airflow to help cool the connector in operation. Another aspect of the invention the division the connector housing into discrete segments to reduce mechanical stresses on the solder connections between the connector and its mounting substrate.

Preferred embodiments of an electrical connector comprise a plurality of electrically-conductive contacts each having a lead portion, a plurality of solder balls each attached to the lead portion of a respective one of the contacts, and a housing having a plurality of pedestals that each receive the lead portion of a respective one of the contacts.

Preferred embodiments of an electrical connector for mounting on a substrate comprise a plurality of electrically-conductive contacts, a plurality of fusible elements each attached to a respective one of the contacts, and a housing having a plurality of voids formed therein, wherein the voids face the substrate when the connector is mounted on the substrate, and the voids extend in a first and a substantially perpendicular second direction.

Preferred embodiments of an electrical connector comprise a plurality of electrical contacts each having a lead portion, a plurality of fusible elements each attached to the lead portion of a respective one of the contacts, and a housing, wherein the contacts extend through the housing, and a bottom portion of the housing is divided into a plurality of segments each associated with a respective one of the lead portions.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF ILLUSTRATIVE EMBODIMENTS

FIGS. 1 to 11 depict a preferred embodiment of an electrical connector 10. The figures are each reference to a common coordinate system 11 depicted therein. The connector 10 is a vertical BGA header connector. This particular type of connector is described for exemplary purposes only; the principles of the present invention can be applied to other types of connectors, including receptacle connectors and non-BGA connectors.

Figure 10:
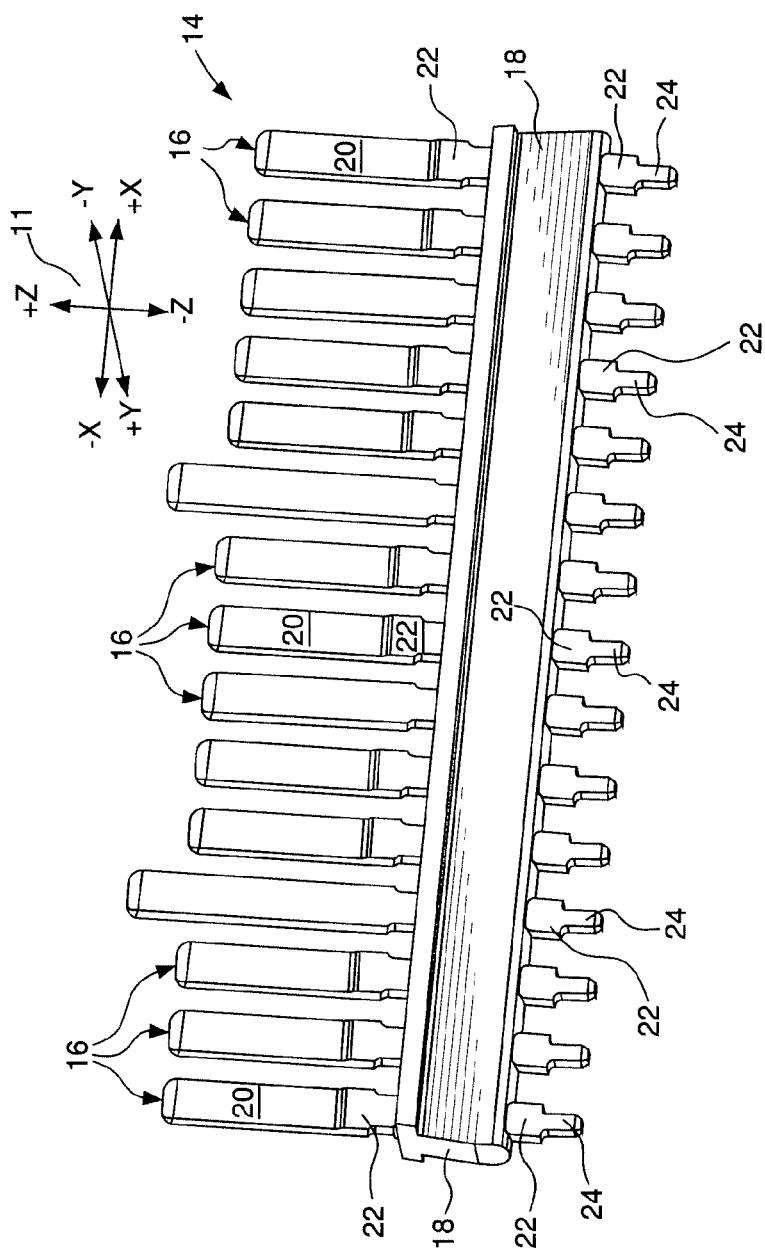
FIG. 10 is a perspective view of an insert-molded leadframe assembly of the connector shown in FIGS. 1–9.

The connector 10 comprises a housing 12, and a plurality of insert-molded leadframe assemblies (IMLAs) 14 mounted on the housing 12. Each IMLA 14 includes a plurality of electrically-conductive contacts 16, as shown in FIG. 10. Each IMLA 14 also includes an overmolded frame 18 that holds the associated contacts 16, so that the contacts 16 form a linear array. The housing 12 and the frame 18 are formed from a suitable electrically-insulative material such as plastic.

The connector 10 is depicted with ten of the IMLAs 14, and each IMLA 14 is depicted with fifteen of the contacts 16 for exemplary purposes only. The housing 12 can include more or less than ten IMLAs 14, and each IMLA 14 can include more or less than fifteen contacts 16 in alternative embodiments. Moreover, the contacts 16 can be mounted directly on the housing 12, without the use of IMLAs, in other alternative embodiments.

Figure 1:
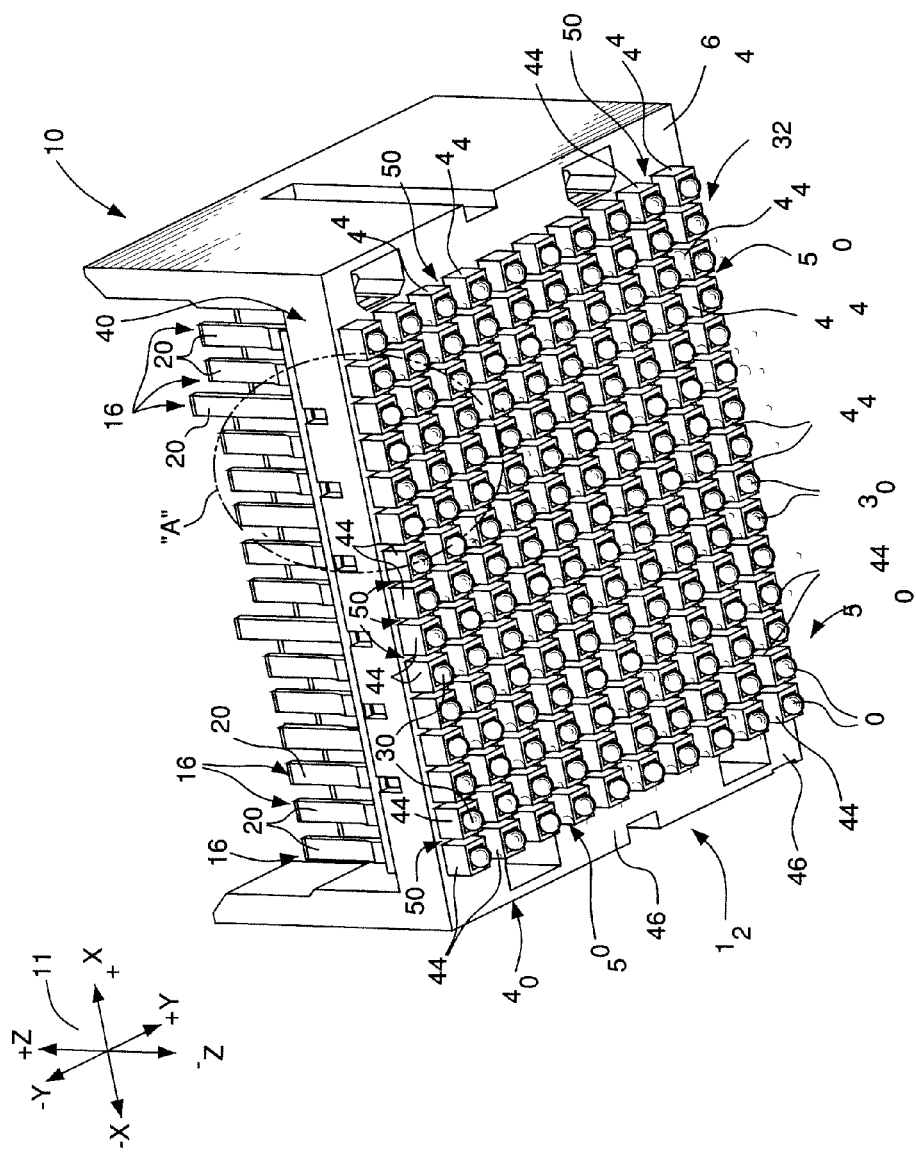
FIG. 1 is a bottom perspective view of a preferred embodiment of an electrical connector.
Figure 2:
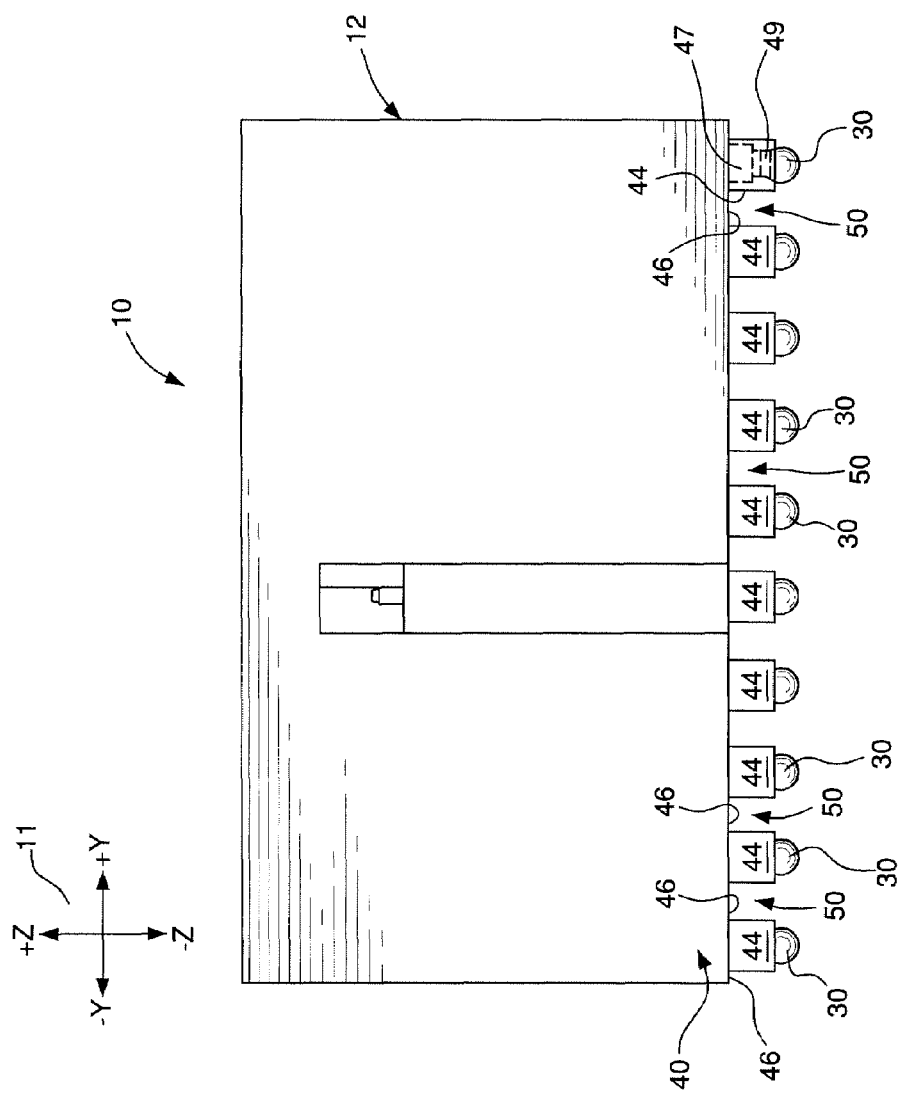
FIG. 2 is a side view of the connector shown in FIG. 1.
Figure 3:
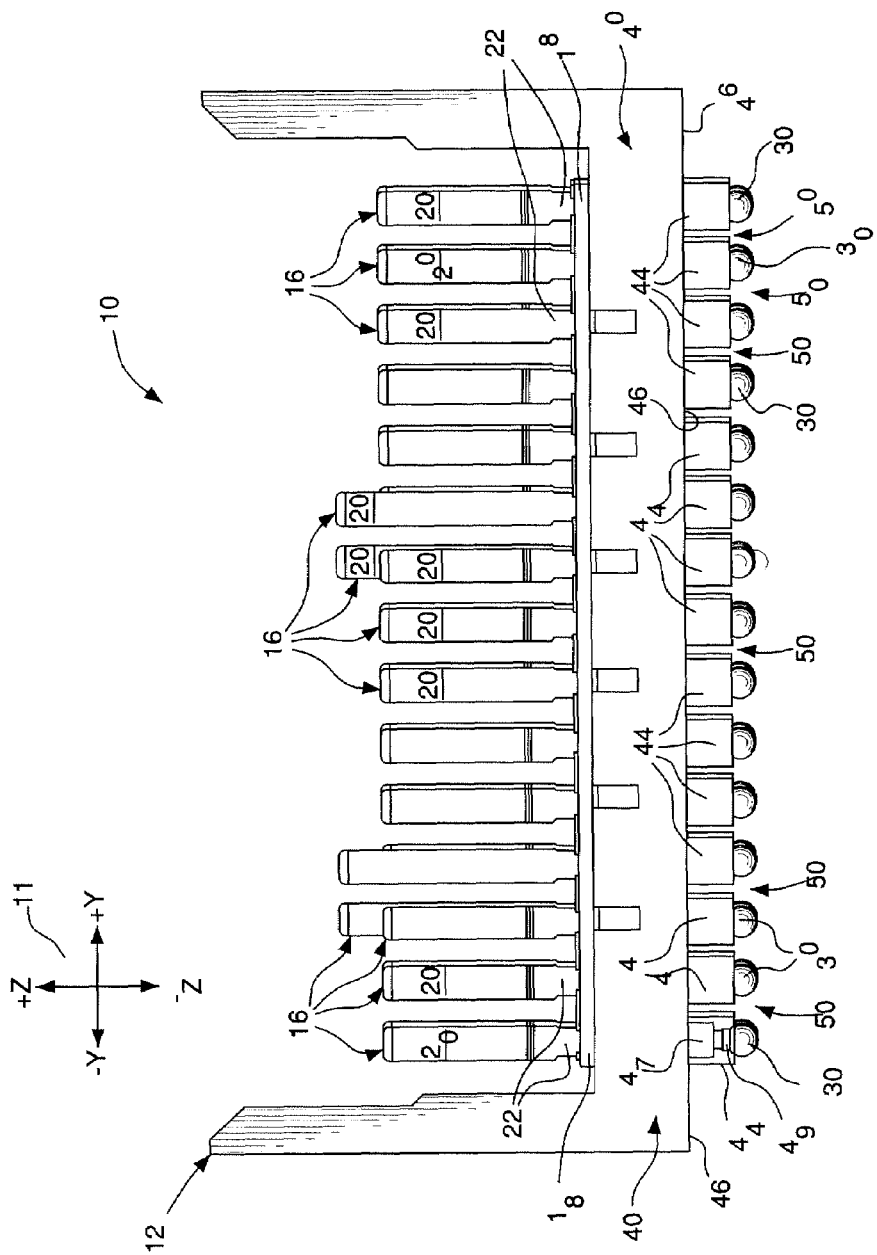
FIG. 3 is a side view of the connector shown in FIGS. 1 and 2, from a perspective rotated approximately ninety degrees from the perspective of FIG. 2.
Figure 4:
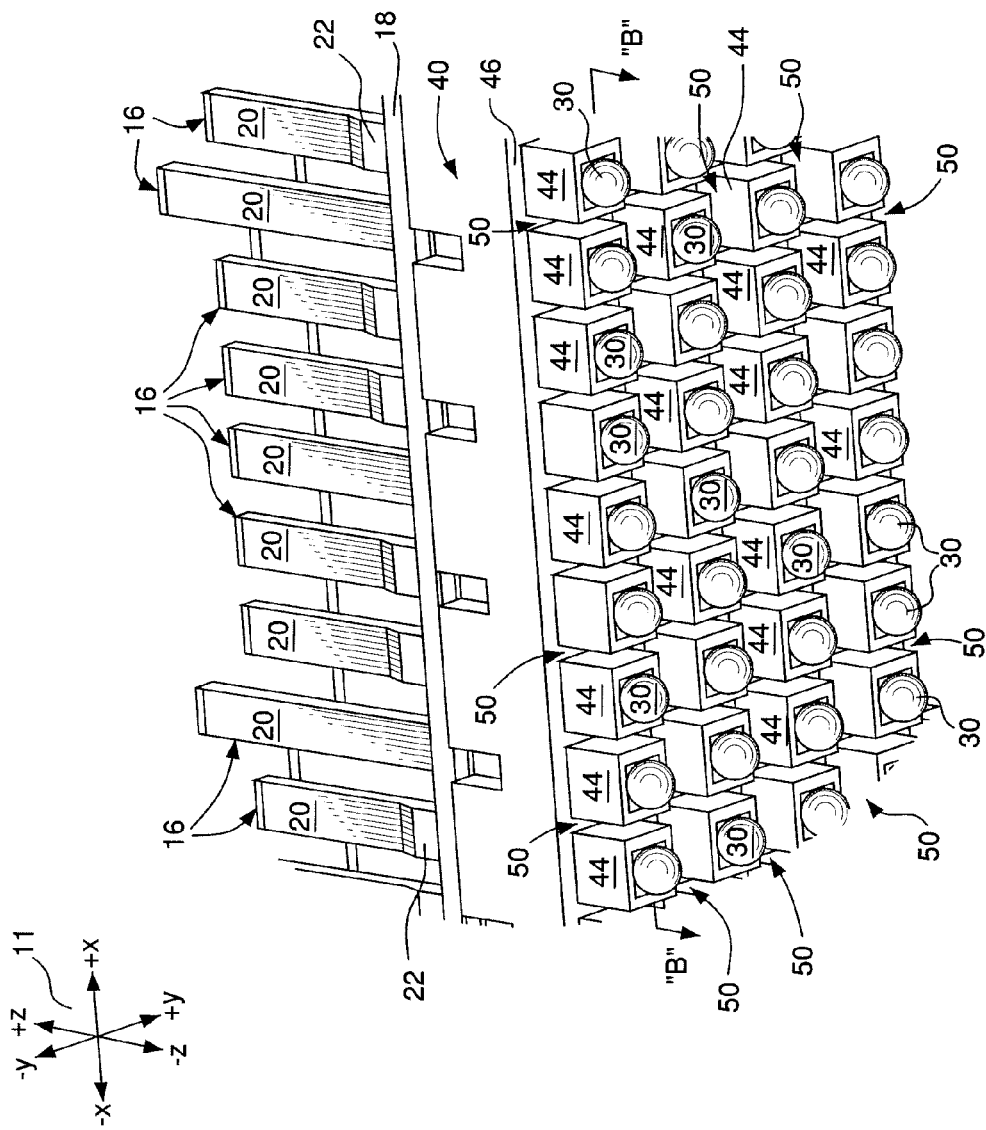
FIG. 4 is a magnified view of the area designated "A" in FIG. 1.

Each contact 16 includes a blade 20, an intermediate portion 22 that adjoins the blade 20, and a lead 24 that adjoins the intermediate portion 22, as shown in FIG. 10. The frame 18 is formed around the intermediate portion 22. The frame 18 is shown in partial cutaway in FIG. 7, to reveal the intermediate portions 22 of the contacts 16 depicted therein. The blade 20 extends upward from the intermediate portion 20 when the connector 10 is oriented as depicted in FIG. 1. The blade 20 of each contact 16 can mate with a complementary contact of a receptacle connector (not shown) when the connector 10 and the receptacle connector are mated. The contacts 16 can be used as power, signal, and/or ground contacts.

Specific details of the contacts 16 are presented herein for exemplary purposes only; the principles of the invention can be applied to connectors having other types of contacts, such as receptacle contacts.

The connector 10 also includes a plurality of fusible elements in the form of solder balls 30. The solder balls 30 are each attached to the lead 24 an associated contact 16, and collectively form a ball-grid array 32 as shown in FIG. 1. The ball-grid array 32 is used to mechanically and electrically connect the connector 10 to a substrate such as a PCB 34 shown in FIGS. 8 and 9. In particular, the solder balls 30 are melted during a reflow operation to form solder connections 35 between the contacts 16 and associated contact pads on the PCB 34.

The use of the connector 10 in conjunction with the PCB 34 is described herein for exemplary purposes only. The connector 10 can also be mounted on other types of substrates.

Figure 11:
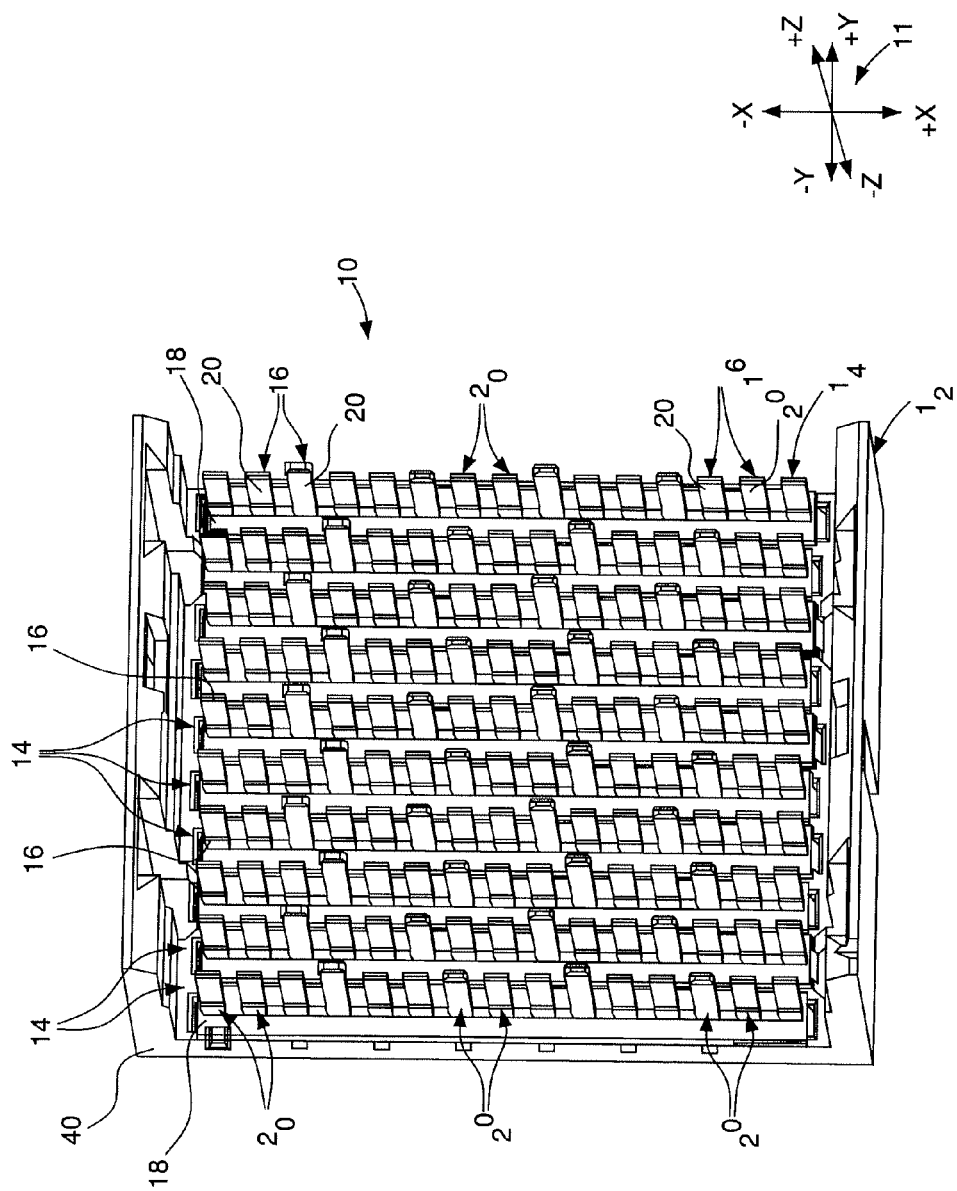
FIG. 11 is a top perspective view of the connector shown in FIGS. 1–10.

The housing 12 includes a body 40. The body 40 receives the frames 18 of the IMLAs 14. The body 40 defines pockets that each receive an associated one of the frames 18, as shown in FIG. 11. The frames 18 can be retained in the pockets by a suitable means such as an interference fit, thereby retaining the IMLAs 14 in the housing 12. The IMLAs 14 can also be retained in the housing 12 by an interference fit between the housing 12 and the portions of the contacts 20 that extend below the frames 18. Other retaining means such as latches, keys, etc., can be used in addition to, or in lieu of an interference fit in alternative embodiments.

The housing 12 also includes a plurality of posts, or pedestals 44. Each pedestal 44 receives a portion of an associated one of the contacts 16, as discussed below. The pedestals 44 are unitarily formed with the body 40. The pedestals 44 project from a bottom surface 46 of the body 40 as shown, for example, in FIGS. 1, 4, and 7. The pedestals 44 can be formed separately from the body 40, and can be attached to the body 40 by a suitable means such as adhesive, in alternative embodiments. Each pedestal 44 preferably has a substantially square transverse cross section. The pedestals 44 can have a circular or other non-square cross section in alternative embodiments. In general, each pedestal 44 should be about the same height ("z" dimension) as the portion of the contact 16 that is received by the pedestal 44. The pedestals 44 otherwise are preferably of a height that permits the pedestals 44 to be manufactured without undue difficulty or expense.

Figure 7:
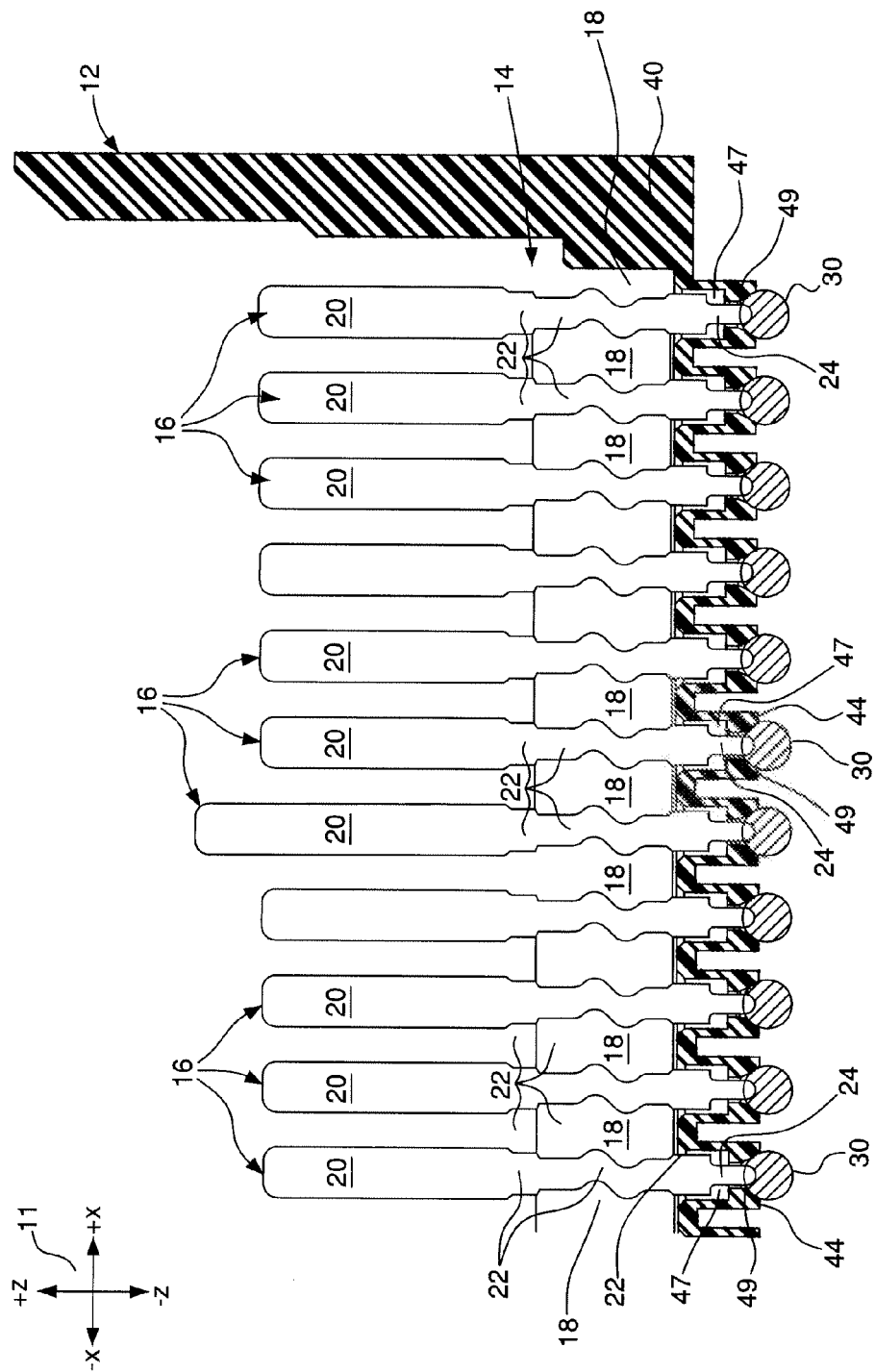
FIG. 7 is a cross-sectional view taken through the line "B—B" of FIG. 4.
Figure 8:
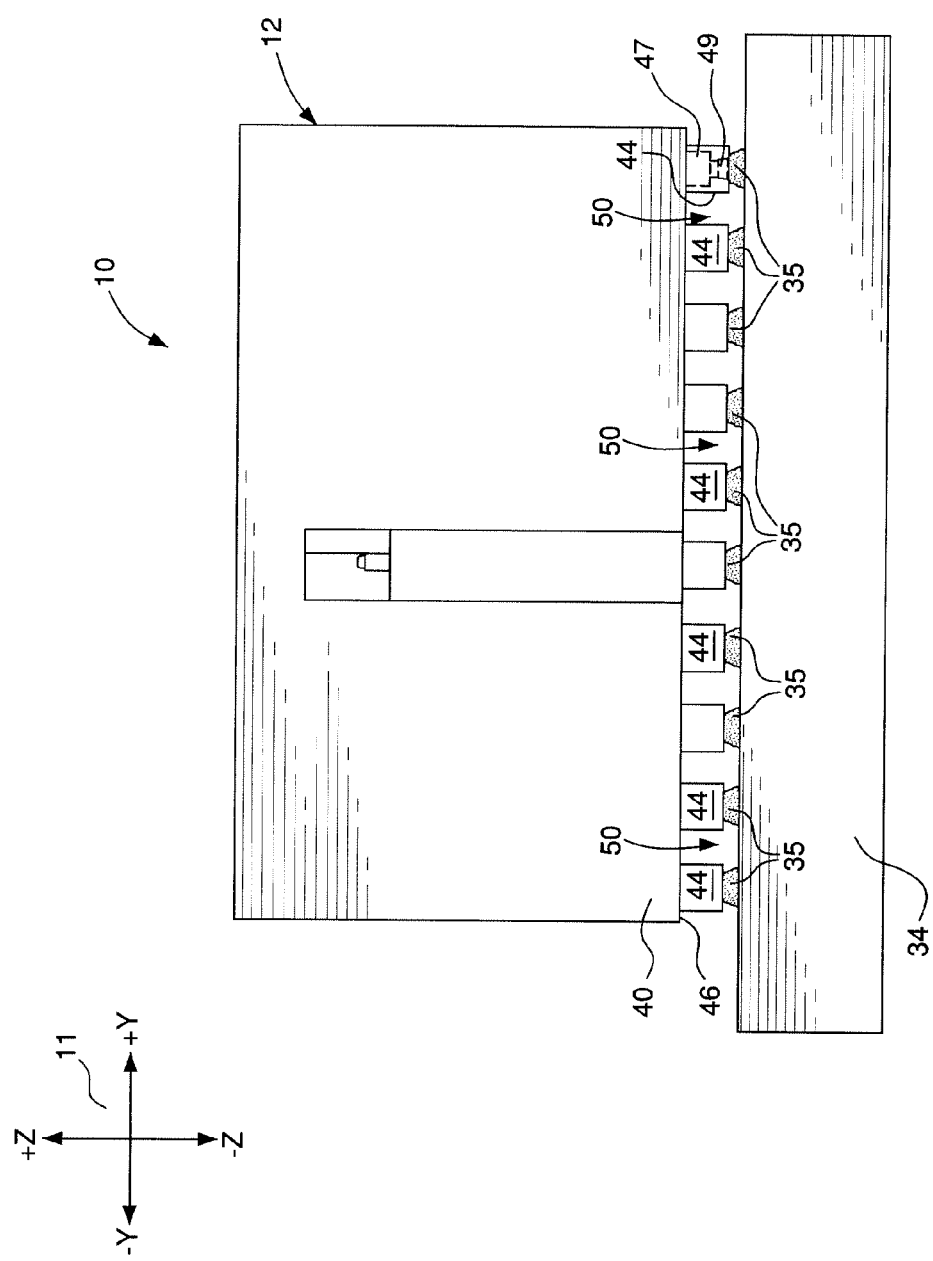
FIG. 8 is a side view of the connector shown in FIGS. 1–7, mounted on a printed circuit board.
Figure 9:
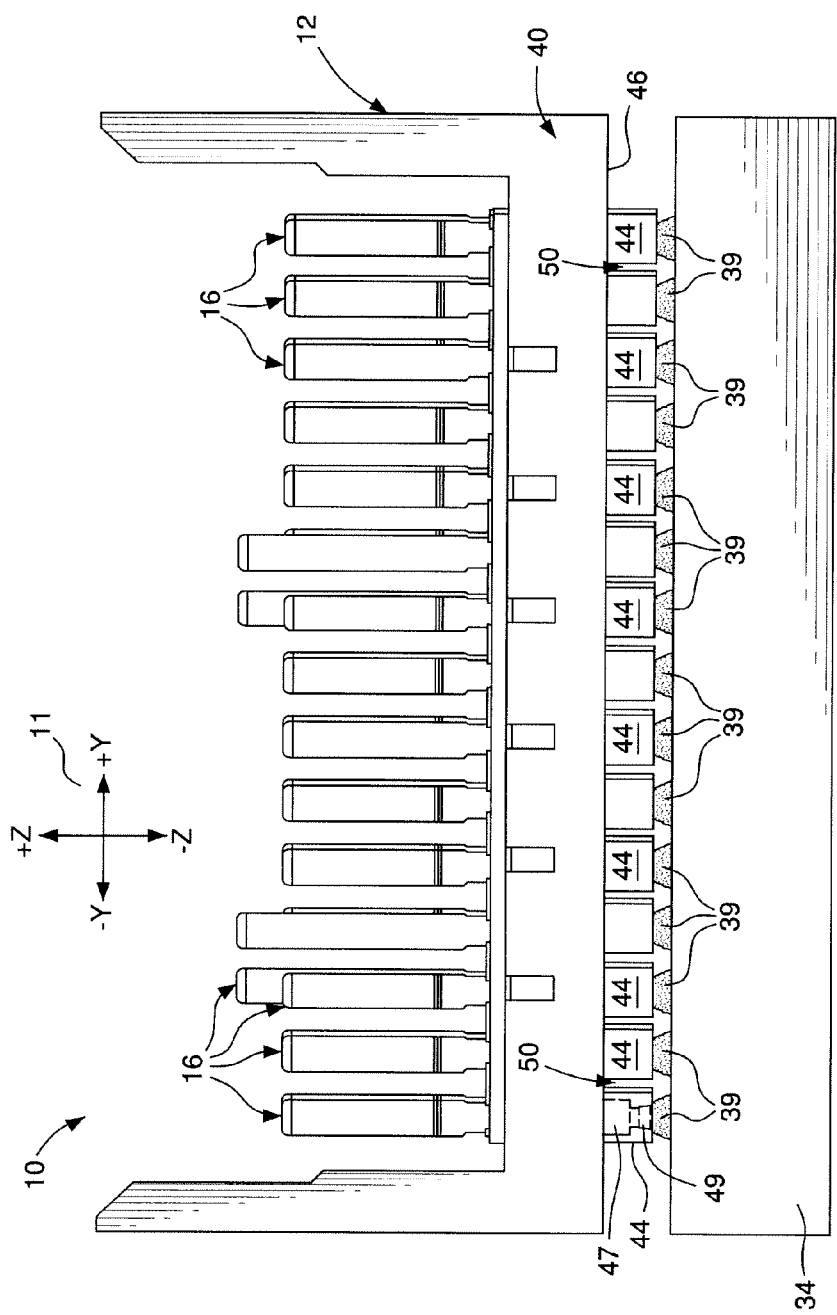
FIG. 9 is a side view of the connector shown in FIGS. 1–8, mounted as shown in FIG. 8, from a perspective rotated approximately ninety degrees from the perspective of FIG. 8.

Each pedestal 44 has a passage 47 formed therein, as shown in FIG. 7. One of the pedestals 44 is shown in partial cutaway in each of FIGS. 2, 3, 8, and 9, to reveal the associated passage 47. The passages 47 each receive portions of the intermediate portion 22 and the lead 24 of the associated contact 16. The upper portion of each passage 47 can be wider than the lower portion thereof, to accommodate the different widths ("x" dimensions) of the respective intermediate portion 22 and lead 24. Clearance between the lead 24 and the adjacent surfaces of the pedestal 44 should be minimized, to discourage wicking of the molten solder during the reflow operation that forms the solder connections 35.

Figure 5:
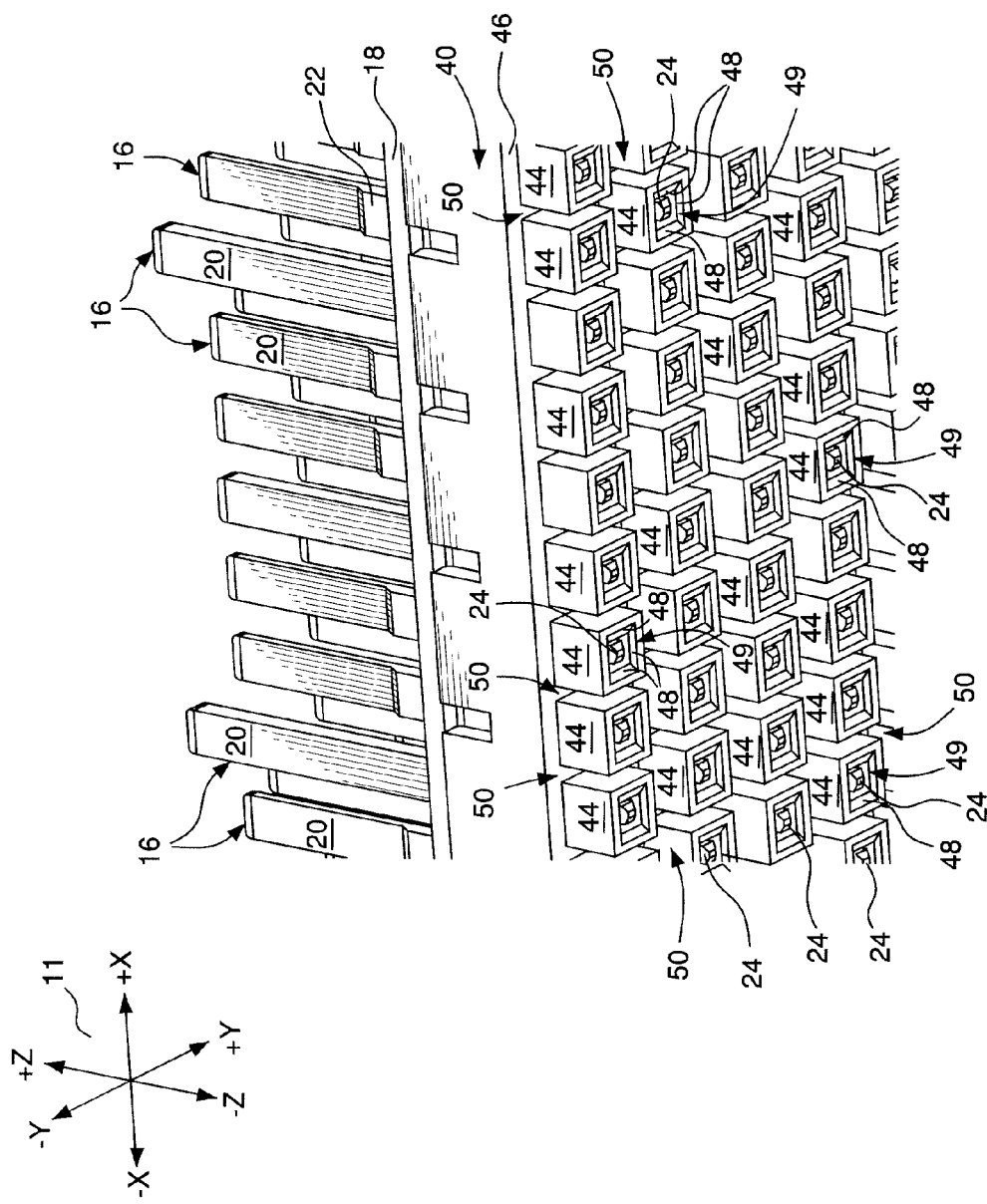
FIG. 5 is a magnified view of the area designated "A" in FIG. 1, depicting the connector without its solder balls for illustrative purposes.
Figure 6:
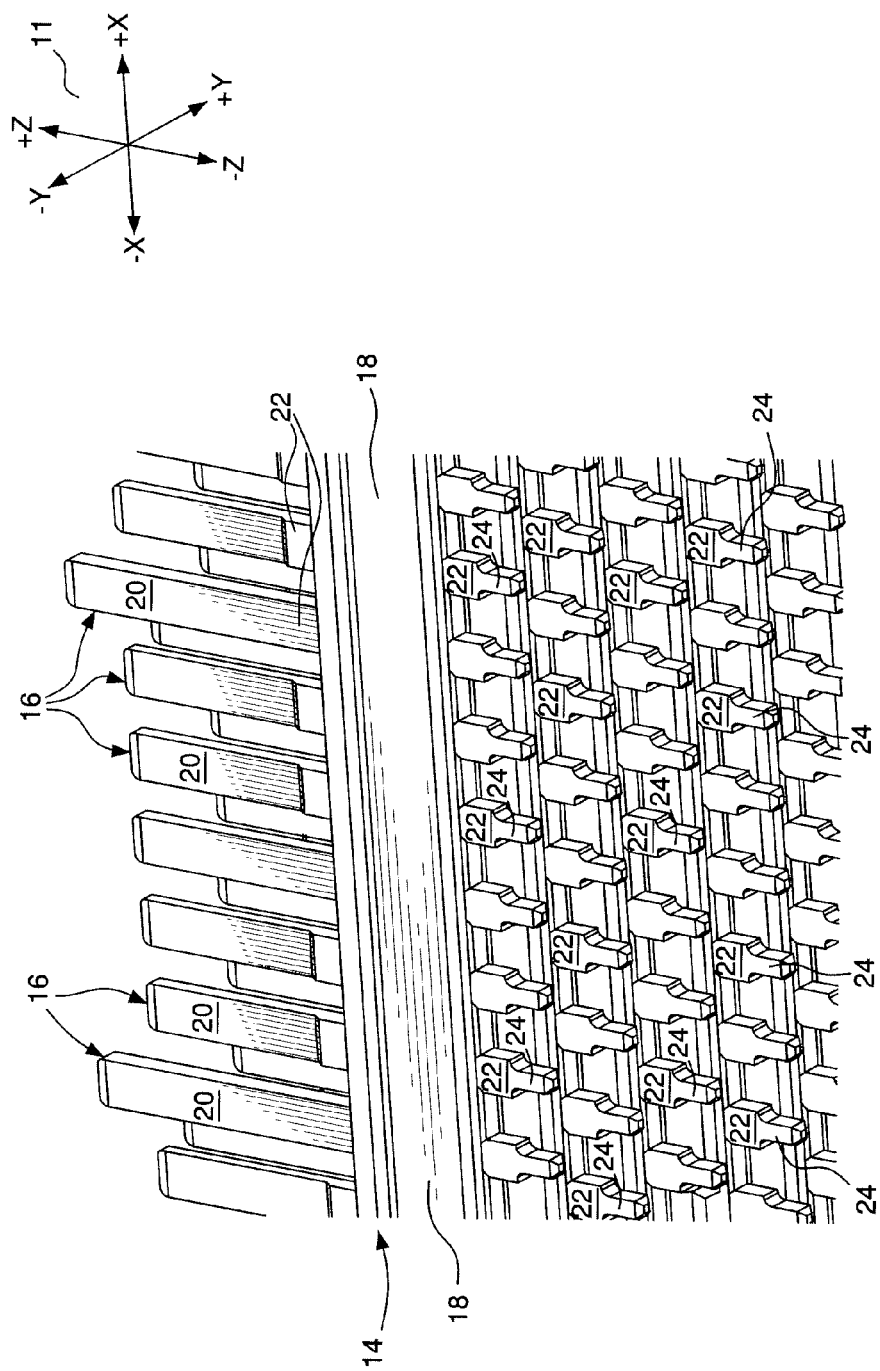
FIG. 6 is a magnified view of the area designated "A" in FIG. 1, depicting the connector without its housing and solder balls for illustrative purposes.

Each pedestal 44 preferably includes four angled surfaces 48 as shown, for example, in FIGS. 5 and 7. The angled surfaces 48 define a recess or ball pocket 49 that adjoins the passage 47 of the pedestal 44. One of the recesses 49 is visible in the partial cutaway views of the pedestal 44 in FIGS. 2, 3, 8, and 9. The lead 24 of the associated contact 16 extends into the recess 49. The recess 49 receives the uppermost portion of the associated solder ball 30.

The angled surfaces 48, it is believed, help to maintain the associated solder ball 30 in a substantially centered position in relation to the lead 24 as the solder ball 30 is reflowed to form the solder connection 35. The surfaces 48 are preferably angled by about 110 degrees in relation to the horizontal direction, i.e., in relation to a plane extending in the "x-y" directions; the surfaces 48 can be angled by more or less than this value in alternative embodiments. The optimum value for the noted angle can vary with factors such as the dimensions of the recesses 49, the arc of the surface of the solder balls 30, and the dimensions of the leads 24. An angle of about 110 degrees is preferred where the bottom of each recess 49 is a square opening of about 0.62 mm by about 0.62 mm, and the diameter of the solder balls 30 is about 0.76 inches.

The pedestals 44 are arranged in rows, so as to match the linear arrangement of the contacts 16 in the IMLAs 14. The center to center spacing between adjacent pedestals 44 substantially matches the center to center spacing between adjacent contacts 16.

Each pedestal 44 is spaced apart from adjacent ones of the pedestals 44, so that the pedestals 44 and the bottom surface 46 of the body 40 define channels or voids 50. Each void 50 preferably extends over substantially the entire length ("x" direction), or width ("y" direction) of the housing 12 and the ball-grid array 32, as shown in FIG. 1. It is believed that the voids 50 help to promote substantially uniform heating of the solder balls 30 during the reflow operation that forms the solder connections 35, in the following manner.

Prior to the reflow operation, the connector 10 is placed on the PCB 34 so that each solder ball 30 substantially aligns with a corresponding electrically-conductive contact pad on the PCB 34. The connector 10 and the PCB 34 are then placed in a reflow convention oven or other type of heating device (not shown), and heated by a thermally-excited medium such as heated air.

The heating of the solder balls 30 eventually causes the solder balls 30 to melt. The molten solder is allowed to cool after the connector 10 and the PCB 34 reach a zone within the oven with a lower temperature. The molten solder, upon cooling, solidifies into the solder connections 35.

The voids 50, it is believed, increase the rate of heat transfer to the solder balls 30 during the reflow operation. In particular, the voids 50 act as flow paths for the heated air flowing over the connector 10. These flow paths help to direct the heated air to the innermost, i.e., centrally-located, solder balls 30 in the ball grid array 32. The increased airflow to the innermost solder balls 30 can increase the heat transfer rate to those solder balls 30. The voids 50 can thereby help to minimize or reduce substantial disparities between the temperatures of the outermost and innermost solder balls 30 during the reflow operation.

The air circulation facilitated by the voids 50 can potentially reduce the need to subject the connector 10 and the PCB 34 to excessive temperatures or relatively lengthy dwell times in the solder reflow oven to ensure adequate heating of the innermost solder balls 30. In addition, the relatively uniform heating of the solder balls 30 that is believed to result from the air circulation can potentially enhance the uniformity, integrity, and reliability of the solder connections 35 throughout the ball-grid array 32.

The voids 50 can be used in connection with other techniques to affect the heating of the solder balls 30. For example, the connector 10, and alternative embodiments thereof, can be equipped with a cap such as the cap disclosed in pending U.S. patent application Ser. No. 10/340,279, filed Jan. 10, 2003, of which is incorporated by reference herein in its entirety, to retard the melting of the solder balls 30 by blocking the voids 50.

Moreover, the body 40 of the housing 12 can be equipped with apertures that extend between the top and bottom thereof to further facilitate air circulation through the connector 10. Apertures of this type are disclosed in the above-referenced U.S. patent application Ser. No. 11/284,154.

The voids 50 can also facilitate circulation of ambient air through the connector 10 during operation, thereby promoting cooling of the connector 10.

Moreover, it is believed that the configuration of the housing 12 can help to reduce or eliminate stresses on the solder connections 35 induced by differences between the thermal expansion of the housing 12 and the PCB 34. In particular, the use of the pedestals 44 divides the bottom portion of the housing 12 into relatively small, discrete segments that can deflect independently, or semi-independently of each other. The pedestals 44 thus offer less resistance to relative movement between the PCB 34 and the housing 12, in comparison to a conventional housing that is not divided into discrete segments. As the housing 12 and the PCB 34 are mechanically interconnected by way of the solder connections 35, the relative flexibility of the pedestals 44 can help reduce mechanical stresses on the solder connection 35 as the housing 12 and the PCB 34 deflect at different rates due to heating or other causes. The configuration of the housing 12 can thus help to preserve the integrity, and prolong the life of the solder connections 35.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

What is claimed is:

1. An electrical connector, comprising:
   a plurality of electrically-conductive contacts each having a lead portion;
   a plurality of solder balls each attached to the lead portion of a respective one of the contacts; and
   an electrically-insulative housing having a body portion and a plurality of pedestals that each extend from the body portion and receive the lead portion of a respective one of the contacts.

2. The connector of claim 1, wherein adjacent ones of the pedestals define voids that separate the adjacent ones of the pedestals whereby the lead portions of the contacts are mechanically isolated by the voids.

3. The connector of claim 2, wherein the solder balls form a ball grid array, and the voids extend across a substantial entirety of a length and a width of the ball grid array, whereby the voids facilitate circulation of air to the solder balls located at innermost positions within the ball grid array.

4. The connector of claim 1, wherein the pedestals are positioned between the body portion and the solder balls.

5. The connector of claim 1, wherein the pedestals and the body portion are unitarily formed.

6. The connector of claim 1, wherein each of the pedestals has a substantially square cross section.

7. The connector of claim 1, wherein each of the pedestals defines a recess that receives a portion of a respective one of the solder balls.

8. The connector of claim 7, wherein the recesses are defined by angled surfaces of the pedestals, and the angled surfaces maintain the solder balls in a substantially centered position in relation to the associated pedestals as the solder balls are melted during a reflow operation.

9. The connector of claim 1, wherein each of the pedestals has a passage formed therein for receiving the lead portion of the respective one of the contacts.

10. An electrical connector for mounting on a substrate, comprising:
   a plurality of electrically-conductive contacts;
   a plurality of fusible elements each attached to a respective one of the contacts; and
   an electrically-insulative housing having a plurality of pedestals that each receive a respective one of the electrically-conductive contacts, wherein the pedestals define voids that face the substrate when the connector is mounted on the substrate, and the voids extend in a first and a substantially perpendicular second direction and form unobstructed airflow paths between opposite sides of the housing, the airflow paths having a depth equal to at least a height of the pedestals.

11. The connector of claim 10, wherein the voids extend in a widthwise and a lengthwise direction of the housing.

12. The connector of claim 10, wherein each of the contacts includes a lead portion that extends through a bottom portion of the housing, and the voids extend between the lead portions of adjacent ones of the contacts.

13. The connector of claim 10, wherein each of the lead portions extends through a respective one of the pedestals, and the pedestals are separated from adjacent ones of the pedestals by the voids whereby the lead portions and the fusible elements are mechanically isolated from adjacent ones of the lead portions and the fusible elements.

14. The connector of claim 10, wherein the voids are formed in a bottom portion of the housing, and each of the voids extends over a substantial entirety of a length or a width of the bottom portion whereby the voids can channel air across the bottom portion.

15. The connector of claim 10, wherein each of the pedestals defines a recess that receives a portion of a respective one of the fusible elements.

16. An electrical connector, comprising:
   a plurality of electrical contacts each having a lead portion;
   a plurality of fusible elements each attached to the lead portion of a respective one of the contacts; and
   an electrically-insulative housing comprising a top portion and a bottom portion, wherein the contacts extend through the housing, and a only the bottom portion of the housing is divided into a plurality of segments each associated with a respective one of the lead portions.

17. The connector of claim 16, wherein the segments are mechanically isolated by voids that extend between the segments.

18. The connector of claim 17, wherein the fusible elements form an array, and each of the voids extends across a substantial entirety of a length or a width of the array, whereby the voids promote air circulation to innermost ones of the fusible elements in the array.

19. The connector of claim 16, wherein each of the lead portions of the contacts extends through a respective one of the segments.

20. The connector of claim 16, wherein the housing further comprises a body portion and the segments extend from the body portion.

21. The connector of claim 20, further comprising a plurality of insert molded leadframe assemblies that each include a plurality of the contacts and a frame molded over the plurality of the contacts, wherein the body portion of the housing receives and retains the frames of the insert molded leadframe assemblies.

22. The connector of claim 20, wherein the segments and the body portion are unitarily formed.

* * * * *